(12) United States Patent
Hua (10) Patent No.: US 8,441,118 B2
(45) Date of Patent: May 14, 2013

(54) ELECTROMIGRATION-RESISTANT AND COMPLIANT WIRE INTERCONNECTS, NANO-SIZED SOLDER COMPOSITIONS, SYSTEMS MADE THEREOF, AND METHODS OF ASSEMBLING SOLDERED PACKAGES

(75) Inventor: Fay Hua, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 12/589,409

(22) Filed: Oct. 22, 2009

(65) Prior Publication Data

US 2010/0047971 A1 Feb. 25, 2010

Related U.S. Application Data

(62) Division of application No. 11/173,939, filed on Jun. 30, 2005, now Pat. No. 7,615,476.

(51) Int. Cl.
*H01L 23/04* (2006.01)

(52) U.S. Cl.
USPC ............ 257/698; 257/778; 257/E23.011

(58) Field of Classification Search .......... 438/106, 438/108, 122, 612, 613, 617; 257/E21.508, 257/698, 700, 737, 738, 778, 780, E23.011
See application file for complete search history.

(56) References Cited

U.S. PATENT DOCUMENTS

| | | | |
|---|---|---|---|
| 5,086,966 A | 2/1992 | Melton et al. | |
| 5,454,161 A | 10/1995 | Beilin et al. | |
| 5,542,602 A | 8/1996 | Gaynes et al. | |
| 5,573,602 A | 11/1996 | Banerji et al. | |
| 5,722,160 A * | 3/1998 | Uemura et al. | ............ 29/840 |
| 5,770,126 A | 6/1998 | Singh et al. | |
| 5,958,590 A | 9/1999 | Kang et al. | |
| 5,964,963 A | 10/1999 | Turchan et al. | |
| 6,165,629 A | 12/2000 | Sachdev et al. | |
| 6,783,569 B2 | 8/2004 | Cheon et al. | |
| 7,361,995 B2 | 4/2008 | Goh et al. | |
| 7,524,351 B2 | 4/2009 | Hua et al. | |
| 7,615,476 B2 * | 11/2009 | Hua | ............ 438/612 |
| 2003/0059642 A1 | 3/2003 | Mei | |
| 2003/0129608 A1 | 7/2003 | Mirkin et al. | |

(Continued)

FOREIGN PATENT DOCUMENTS

| CN | 1250951 | 4/2000 |
|---|---|---|
| EP | 1107298 | 6/2001 |

(Continued)

OTHER PUBLICATIONS

Office Action Received for European Patent Application No. 06785943.9, mailed on Jun. 22, 2009, 2 pgs.

(Continued)

*Primary Examiner* — Hoai V Pham
(74) *Attorney, Agent, or Firm* — Winkle, PLLC (57) ABSTRACT

A nano-sized metal particle composite includes a first metal that has a particle size of about 50 nanometer or smaller. A wire interconnect is in contact with a reflowed nanosolder and has the same metal or alloy composition as the reflowed nanosolder. A microelectronic package is also disclosed that uses the reflowed nanosolder composition. A method of assembling a microelectronic package includes preparing a wire interconnect template. A computing system includes a nanosolder composition coupled to a wire interconnect.

3 Claims, 6 Drawing Sheets

U.S. PATENT DOCUMENTS

| | | | |
|---|---|---|---|
| 2003/0146019 | A1 | 8/2003 | Hirai |
| 2003/0168130 | A1 | 9/2003 | Shohji |
| 2003/0224104 | A1 | 12/2003 | Fukunaga et al. |
| 2003/0224197 | A1 | 12/2003 | Soga et al. |
| 2004/0115340 | A1 | 6/2004 | Griego |
| 2004/0129344 | A1 | 7/2004 | Arita et al. |
| 2004/0245648 | A1* | 12/2004 | Nagasawa et al. ............ 257/772 |
| 2004/0262726 | A1 | 12/2004 | Hua |
| 2005/0133572 | A1* | 6/2005 | Brese et al. ............. 228/180.22 |
| 2006/0012052 | A1* | 1/2006 | McDevitt et al. ............. 257/778 |
| 2006/0068216 | A1 | 3/2006 | Hua et al. |
| 2006/0261446 | A1* | 11/2006 | Wood et al. ................... 257/621 |

FOREIGN PATENT DOCUMENTS

| | | | |
|---|---|---|---|
| JP | 57-166051 | A | 10/1982 |
| JP | 1214030 | A | 8/1989 |
| JP | 06-182587 | | 7/1994 |
| JP | 07-221104 | A | 8/1995 |
| JP | 10-027825 | A | 1/1998 |
| JP | 2001-338999 | A | 12/2001 |
| JP | 2004-172150 | A | 6/2004 |
| JP | 2004-172612 | A | 6/2004 |
| JP | 2004-327908 | A | 11/2004 |
| KR | 10-2004-0096537 | A | 11/2004 |
| KR | 10-2005-0040812 | A | 5/2005 |
| KR | 1020050040812 | A | 5/2005 |
| TW | 511200 | | 11/2002 |
| WO | 2006/132663 | | 12/2006 |
| WO | 2007/005592 | A2 | 1/2007 |
| WO | 2007/005592 | A3 | 8/2007 |

OTHER PUBLICATIONS

International Preliminary Report on Patentability received for PCT Patent Application No. PCT/US2006/025548, mailed on Jan. 17, 2008, 8 pgs.
Office Action Received for Chinese Patent Application No. 200680022890.X, mailed on Apr. 24, 2009. 11 pgs.
Office Action Received for Taiwan Patent Application No. 95123868, mailed on Nov. 25, 2008. 12 pgs.
Office Action Received for Taiwan Patent Application No. 95123868, mailed on Sep. 14, 2009, 7 pgs.
Tu, K. N., "Recent advances on electromigration in very-large-scale-integration of interconnects", Journal of Applied Physics AIP USA, 94(9), The Institution of Electrical Engineers, Stevenage, GB, Nov. 1, 2003, pp. 5451-5473.
Buffat, P., et al., "Size Effect on the Melting Temperature of Gold Particles", Physical Review A, 13(6), Jun. 1976, pp. 2287-2298.
Dick, K., et al., "Size-Dependent Melting of Silica-Encapsulated GoldNanoparticles", Journal of the American Chemical Society, 124(10), 2002, pp. 2312-2317.
Pawlow, P., "Ober die Abhangigkeit des Schmelzpunktes von der Oberflachenenergie eines festen Korpers (Zusatz.) On the Dependency of Melting Point to the Surface Energy of a Solid Body", Zeitschrift fur Phvsikalische Chemie vol. 65, 1909, pp. 545-548.
International Search Report and Written Opinion received for PCT Patent Application No. PCT/US2006/025548, mailed on Apr. 18, 2007, 14 pgs.
Office Action Received for Korea Patent Application No. 10-2007-7030911, mailed on Jul. 28, 2009, 7 pgs.
Office Action Received for Korean Patent Application No. 10-2007-7030911, mailed on Jul. 26, 2011, 4 pages of Korean Office Action and 3 pages of English Translation.
Office Action Received for Korean Patent Application No. 10-2010-7002031 mailed on Sep. 29, 2011, 5 pages of Korean Office Action and 4 pages of English Translation.
Office Action Received for Korean Patent Application No. 10-2011-7028139, Mailed on Jan. 17, 2012, 9 pages of office Action including 4 pages of English Translation.
Office Action Received for Taiwanese Patent Application No. 95123868, Mailed on Feb. 15, 2012, 8 pages of office Action including 4 pages of English Translation.
Office Action Received for Korean Patent Application No. 10-2007-7030911, mailed on Jun. 30, 2010, 8 pages of Korean Office Action including 4 pages of English Translation.
Preliminary Amendment filed for U.S. Appl. No. 10/957,196, filed Jan. 31, 2007, 8 pages.
Supplemental Preliminary Amendment filed for U.S. Appl. No. 10/957,196, filed Jul. 30, 2007, 7 pages.
Office Action received for U.S. Appl. No. 10/957,196, mailed on Sep. 10, 2007, 10 pages.
Office Action received for U.S. Appl. No. 10/957,196, mailed on Jan. 24, 2008, 7 pages.
Response to Office Action filed for U.S. Appl. No. 10/957,196, filed Nov. 13, 2007, 6 pages.
Response to Office Action filed for U.S. Appl. No. 10/957,196, filed Apr. 2, 2008, 7 pages.
Office Action Received for Japanese Patent Application No. 2008-517235, mailed on Dec. 7, 2010, 4 pages of Japanese Office Action, including 2 pages of English Translation.
Office Action Received for Japanese Patent Application No. 2008-517235, mailed on Jun. 7, 2011, 5 pages of Japanese Office Action, including 3 pages of English Translation.
Office Action received for Taiwan Patent Application No. 101116190, mailed on Dec. 6, 2012, 13 pages of office Action including 7 pages of English translation.
Office Action Received for Korean Patent Application No. 10-2011-7028139, Mailed on Sep. 14, 2012, 7 pages of office Action including 3 pages of English translation.

* cited by examiner

ELECTROMIGRATION-RESISTANT AND COMPLIANT WIRE INTERCONNECTS, NANO-SIZED SOLDER COMPOSITIONS, SYSTEMS MADE THEREOF, AND METHODS OF ASSEMBLING SOLDERED PACKAGES

CROSS-REFERENCE TO RELATED APPLICATIONS

This application is a Divisional application of Ser. No. 11/173,939 filed Jun. 30, 2005, now U.S. Pat. No. 7,615,476 entitled "ELECTROMIGRATION-RESISTANT AND COMPLIANT WIRE INTERCONNECTS, NANO-SIZED SOLDER COMPOSITIONS, SYSTEMS MADE THEREOF, AND METHODS OF ASSEMBLING SOLDERED PACKAGES".

TECHNICAL FIELD

Disclosed embodiments relate to nano-sized solder paste compositions for use in microelectronic device packaging.

BACKGROUND INFORMATION

An integrated circuit (IC) die is often fabricated into a processor for various tasks. IC operation invariably leads to heat generation and thermal expansion stresses in a die package. High melting point solder, although they withstand the high operating temperatures caused by the densely packed circuitry in a die, requires high processing temperature, which can cause high thermal-mechanical stress due to coefficient of thermal expansion (CTE) mismatch between semiconductive die and organic substrate. But for low melting solder, the electro-migration is much more easily to happen. Additionally, corrosion can occur between the two disparate metals of the solder bump and the bond pad.

BRIEF DESCRIPTION OF THE DRAWINGS

In order to understand the manner in which embodiments are obtained, a more particular description of various embodiments will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which.

DETAILED DESCRIPTION

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

An embodiment relates to a wire interconnect that is embedded in a nanosolder. The nanosolder is derived from a solder paste that includes a metal particle having a diameter in a range from about 2 nanometer (nm) to about 50 nm. Thereafter, the solder paste is reflowed and achieves a solidified grain size in a range from about 50 nanometer (nm) to about 20 micrometer (μm). An embodiment includes the wire interconnect and the nanosolder being substantially the same metal. By "substantially the same metal", it is intended to mean substantially the same chemical composition of metal or alloy. Consequently, an embodiment includes a method of operating a device at a current density that is allowed by the presence of the wire interconnect and the nanosolder being substantially the same metal. In an embodiment, a current density that is sustainable for a device is up to $10^6$ amp/cm$^2$.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1A:
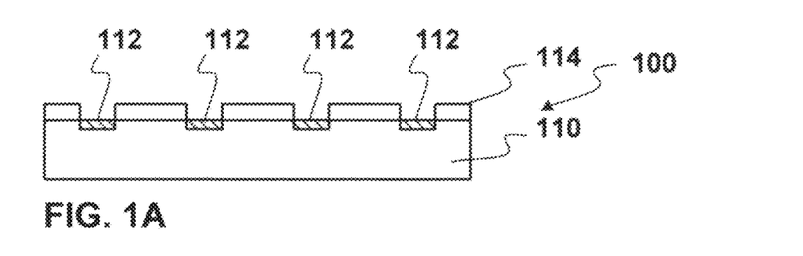
FIG. 1A is a cross section of a microelectronic device during processing according to an embodiment.

FIG. 1A is a cross section of a microelectronic device 100 during processing according to an embodiment. A substrate 110, such as a die that can be a processor, includes a bond pad 112 for electrical communication from the substrate 110 to the outside world. The microelectronic device 100 is depicted as being processed with a patterned mask 114 that exposes the bond pad 112.

In an embodiment, the bond pad 112 is a copper upper metallization layer that can touch any one of several metallization layers. For example, a metallization layer such as metal one (M1, not pictured) in a microelectronic device makes electrical contact with the bond pad 112. In another example, a metallization layer such as metal two (M2, not pictured) makes electrical contact with the bond pad 112. The M2 makes electrical contact with the M1. In another example, a metallization layer such as metal three (M3, not pictured) makes electrical contact with the bond pad 112. The M3 makes electrical contact with the M2, which in turn makes electrical contact with the M1. In another example, a metallization layer such as metal four (M4, not pictured) makes electrical contact with the bond pad 112. The M4 makes electrical contact with the M3. The M3 makes electrical contact with the M2, which in turn makes electrical contact with the M1. In another example, a metallization layer such as metal five (M5, not pictured) makes electrical contact with the bond pad 112. The M5 makes electrical contact with the M4. The M4 makes electrical contact with the M3. The M3 makes electrical contact with the M2, which in turn makes electrical contact with the M1. In another example, a metallization layer such as metal six (M6, not pictured) makes electrical contact with the bond pad 112. The M6 makes electrical contact with the M5. The M5 makes electrical contact with the M4. The M4 makes electrical contact with the M3. The M3 makes electrical contact with the M2, which in turn makes electrical contact with the M1. In another example, a metallization layer such as metal seven (M7, not pictured) makes electrical contact with the bond pad 612. The M7 makes electrical contact with the M6. The M6 makes electrical contact with the M5. The M5 makes electrical contact with the M4. The M4 makes electrical contact with the M3. The M3 makes electrical contact with the M2, which in turn makes electrical contact with the M1. By this disclosure, it becomes clear that various semiconductor substrate structures are applicable to the various embodiments.

Figure 1B:
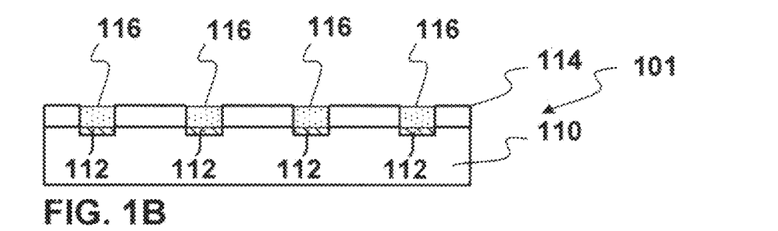
FIG. 1B is a cross section of the microelectronic device depicted in FIG. 1A after further processing.

FIG. 1B is a cross section of the microelectronic device 101 depicted in FIG. 1A after further processing. The patterned mask 114, which in an embodiment is a patterned photoresist, has been filled with a nano-particle solder paste 116 such as a nano-particle solder paste powder 116, according to the various embodiments set forth in this disclosure.

In an embodiment, the nano-particle solder paste 116 includes a volatile binder and a flux vehicle for the nano-particle solder paste 116 during processing. In an embodiment, no patterning per se is done, rather, a fluxed nano-particle (hereinafter, nano-solder) solder paste is blanket formed, and, during heating to a sufficient temperature, the flux vehicle fluidizes and preferentially wets the bond pads 112, and preferentially becomes phobic of the substrate 110, i.e., it does not wet the substrate 110 as well as it wets the bond pad 112. The substrate 110 can be semiconductive, dielectric, and combinations thereof.

Figure 1C:
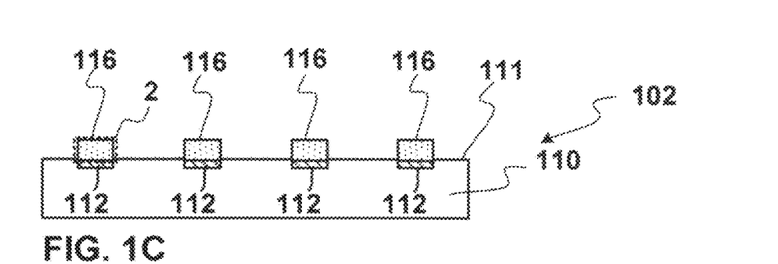
FIG. 1C is a cross section of the microelectronic device depicted in FIG. 1B after further processing.

FIG. 1C is a cross section of the microelectronic device 102 depicted in FIG. 1B after further processing. In this embodiment, the patterned mask 114 has been removed. Removal of the patterned mask 114 can be done by pulling it away from the substrate 110, and thereby leaving the nano-solder paste 116 which is formed as discrete islands directly above the bond pads 112.

Figure 2:
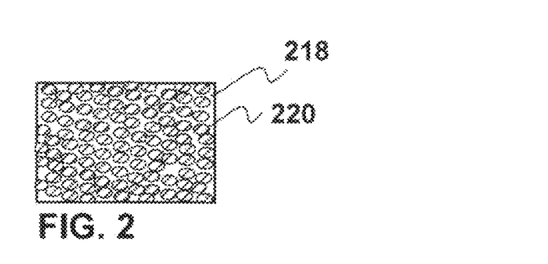
FIG. 2 is a computer image cross-section detail of a nanosolder paste composite depicted in FIG. 1C according to an embodiment.

FIG. 2 is an enlargement of a portion of the microelectronic device depicted in FIG. 1C. FIG. 2 is taken from the area within the dashed line 2 depicted in FIG. 1C. FIG. 2 depicts a metal particle composition precursor as a metal particle composition 218 within a solder paste matrix 220. The metal particle composition 218 includes one of the metal particle composition embodiments set forth in this disclosure. Because the solder paste matrix 220 substantially protects the metal particle composition 218 from corrosive and/or oxidative influences, the metal particle composition 218 can resist substantial grain growth during reflow. In an embodiment, the metal particle composition 218 after reflow has a grain size in a range from about 50 nm to less than or equal to about 20 μm.

In an embodiment, the metal particle composition 218 includes a particle having a size in a range from about 2 nm to 50 nm. In an embodiment, the metal particle composition 218 includes a particle having a size in a range from about 10 nm to about 30 nm. In an embodiment, the metal particle composition 218 includes a particle having a size in a range of about 98% less than or equal to about 20 nm.

Because of the particle size embodiments, nucleation of the metal particles of the metal particle composition to cause a transition from solid to solidus, can be initiated at about 400° C. or lower. For example, gold can experience a solid-to-solidus transition at about 300° C.

In an embodiment, the metal particle composition 218 includes a melting temperature equal to or below about 400° C. Depending upon the metal type and the particle size, the metal particle composition 218 can have a change in melting temperature of several hundred degrees. For example, solid gold has a melting temperature of about 1064° C. When gold is formed into a nano-sized particle as set forth herein, the melting temperature can be reduced to about 300° C.

In an embodiment, the metal particle composition 218 includes a first metal with a particle size in a range of less than or equal to about 20 nm, and the first metal is present alone as a pure metal or as a macroscopically monophasic alloy. In an embodiment, the metal particle composition 218 includes silver (Ag). In an embodiment, the metal particle composition 218 includes copper (Cu). In an embodiment, the metal particle composition 218 includes gold (Au). In an embodiment, the metal particle composition 218 includes the gold tin alloy (Au80Sn20). In an embodiment, the metal particle composition 218 includes tin (Sn). In an embodiment, the metal particle composition 218 includes a combination of at least two of the above metal particle compositions. In an embodiment, the metal particle composition 218 includes a combination of at least three of the above metal particle compositions.

In an embodiment, the metal particle composition 218 includes an Au80Sn20 solder alloy including Au as a core structure and Sn as a shell structure. In an embodiment, the first metal includes silver and the shell structure is selected from copper, gold, lead, and tin. In an embodiment, the core structure includes gold and the shell structure is selected from copper, silver, lead, and tin. In an embodiment, the core structure includes lead and the shell structure is selected from copper, silver, gold, and tin. In an embodiment, the core structure includes tin and the shell structure is selected from copper, silver, gold, and lead. In an embodiment, any of the above core structure and shell structure metal particle compositions include the core structure being present in a greater amount than the shell structure.

In an embodiment, the core structure has a first melting temperature, and the shell structure has a second melting temperature that is less than the first melting temperature. In this embodiment, the core structure can be gold, and the shell structure can be tin.

In an embodiment, the metal particle composition is a core and multiple-shell structure. In an embodiment, the metal particle composition includes in a first part and a second part, but the structure is more a heterogeneous agglomeration than core-shell structure.

Figure 3A:
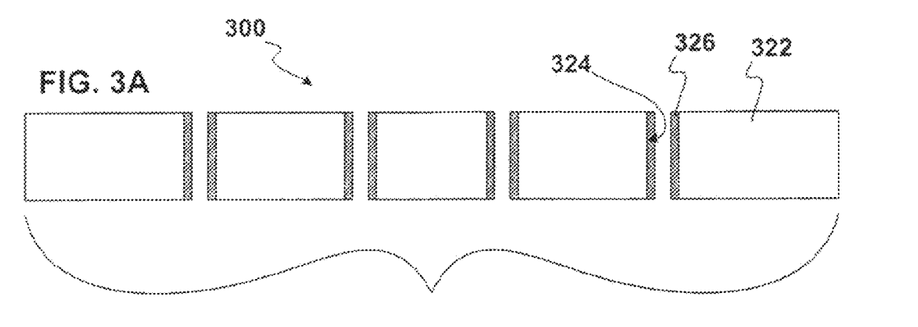
FIG. 3A is a cross section of an interconnect template during processing according to an embodiment.

FIG. 3A is a cross section of an interconnect template 300 during processing according to an embodiment. An interconnect substrate 322 is prepared with a plurality of vias, one of which is designated with the reference numeral 324. In an embodiment, the interconnect substrate 322 is an interlayer dielectric layer (ILD) material such as a polyimide material. Processing of the interconnect template 300 includes forming an interconnect in the via 324.

In an embodiment, the interconnect substrate 322 is patterned with a mask (not pictured) and the plurality of vias 324 is formed by processing such as etching, with the mask, or laser drilling through the mask to simultaneously form the via 324 and to pattern the mask. Other processes can be included such as a punching process to form the via 324.

In an embodiment, the via 324 is prepared by forming a seed layer 326 within the via 324. The mask, if present prevents deposition of a seed layer anywhere except within the vias 324. In an embodiment, the seed layer 326 is formed by chemical vapor deposition (CVD) of a seed metal. For example, where the interconnect is to be copper, a CVD copper process is carried out under plasma conditions to form the seed layer 326 in preparation for electrodeposition of copper to fill the via 324. In an embodiment, an angled physical vapor deposition (PVD) is carried out on both sides of the via 324, such that the seed layer 326 is substantially uniformly deposited along the via 324. Where a PVD process is used for formation of the seed layer 326, the mask can be removed thereafter by rinsing with a mask solvent or other suitable conventional mask-removal process.

Figure 3B:
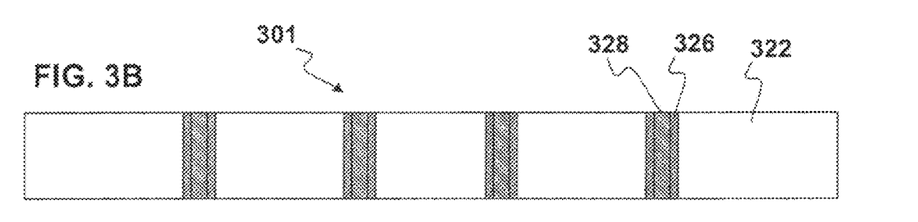
FIG. 3B is a cross section of the interconnect template depicted in FIG. 3A after further processing according to an embodiment.

FIG. 3B is a cross section of the interconnect template depicted in FIG. 3A after further processing according to an embodiment. The interconnect substrate 322 includes the seed layer 326 disposed within the via 324 in preparation for further processing. In an embodiment, the via 324 has been filled by electroplating of the wire interconnect 328 upon the seed layer 326 within the via 324.

In an embodiment, each wire interconnect 328 has a thickness in a range from about 20 μm to about 106 μm. In an embodiment, the wire interconnect 328 has a thickness of about 40 μm. The interconnect thickness can include the seed layer 326.

A compliant interconnect is achievable by forming an interconnect that can flex (i.e., compliant) without fracture in connection with the solder bump. A compliant interconnect is achievable by using substantially the same metal for both structures. A compliant interconnect is also achievable by using a height-to-width aspect ratio in connection with substantially the same metal for both structures. In an embodiment, the wire interconnect 328 has a height-to-width aspect ratio in a range from about 0.5:1 to about 5:1. In an embodiment, the wire interconnect 328 has a height-to-width aspect ratio in a range from about 1:1 to about 4:1. In an embodiment, the wire interconnect 328 has a height-to-width aspect ratio in a range from about 2:1 to about 3:1. In an embodiment, the wire interconnect 328 has a height-to-width aspect ratio of about 3.5:1.

Figure 4:
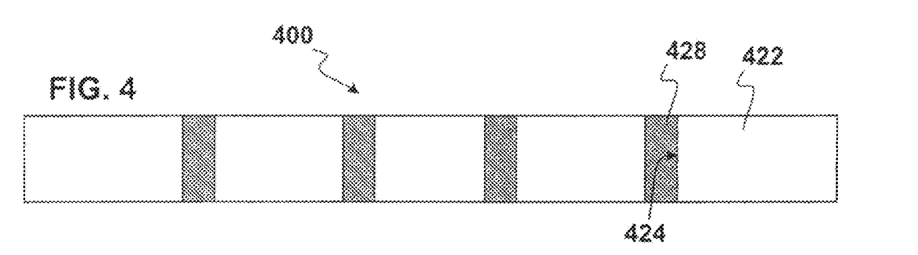
FIG. 4 is a cross section of an interconnect template during processing according to an embodiment.

FIG. 4 is a cross section of an interconnect template 400 during processing according to an embodiment. In an embodiment, the interconnect template 400 includes an interconnect substrate 422 and a wire interconnect 428. In this embodiment, the wire interconnect 428 is a wire that has been filled into the interconnect template 422 by physically inserting the wire interconnect 428 into a via 424. In an embodiment, plating is carried out by first electroless plating into the via 424, followed by electroplating to fill the via 424.

Figure 5:
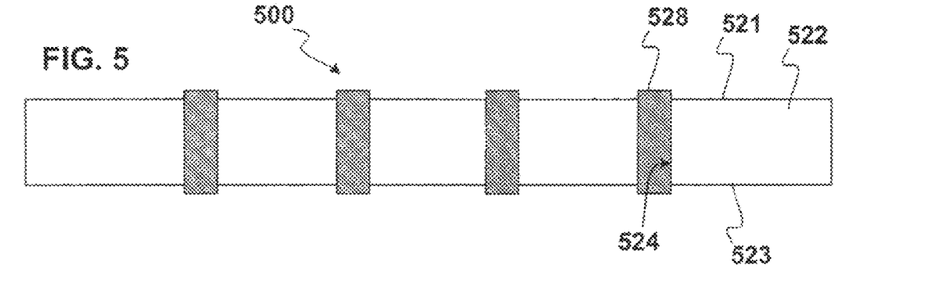
FIG. 5 is a cross section of an interconnect template during processing according to an embodiment.

FIG. 5 is a cross section of an interconnect template 500 during processing according to an embodiment. An interconnect substrate 522 is prepared with a plurality of vias, one of which is designated with the reference numeral 524. In an embodiment, the interconnect substrate 522 is an interlayer dielectric layer (ILD) material such as a polyimide material. In this embodiment, the wire interconnect 528 is a wire that has been filled into the interconnect template 522 by physically inserting the wire interconnect 528 into a via 524. In an embodiment, the via 524 has been filled by electroplating of a wire interconnect 528.

Processing has achieved a wire interconnect 528 in the interconnect substrate 522 with an upper surface 521 and a lower surface 523. The wire interconnect 528 extends at least one of above and below the interconnect substrate 522. In an embodiment, the interconnect substrate 522 has been etched back to expose the interconnect 528.

Figure 1D:
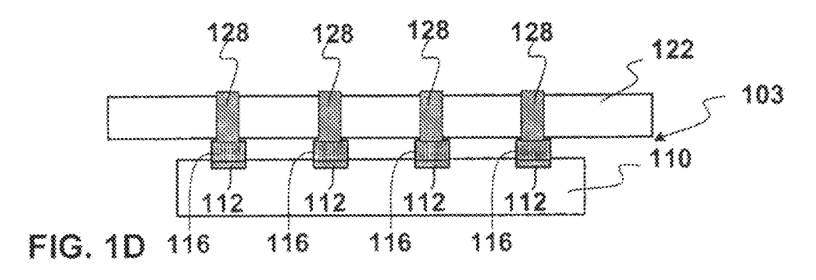
FIG. 1D is a cross section of the microelectronic device depicted in FIG. 1C after further processing.

FIG. 1D is a cross section of the microelectronic device 103 depicted in FIG. 1C after further processing. The substrate 110, bond pad 112, and nano-solder paste 116 are brought into contact with a wire interconnect 128 such as the wire interconnect 528 that is disposed in the interconnect template 500 depicted in FIG. 5. In an embodiment, the wire interconnect 128 includes silver. In an embodiment, the wire interconnect 128 includes copper. In an embodiment, the wire interconnect 128 includes gold. In an embodiment, the wire interconnect 128 includes the gold tin alloy Au80Sn20. In an embodiment, the wire interconnect 128 includes tin. In an embodiment, the wire interconnect 128 includes a combination of the above metals and alloys. In an embodiment, any of the wire interconnect embodiments set forth in this disclosure is brought into contact with the nano-solder paste 116.

In an embodiment, the nano-solder paste 116 includes a flux vehicle intermingled with paste during processing. In an embodiment, a flux vehicle is activated in the solder paste 116 during heating. In an embodiment, the flux vehicle is a sulfonamide that activates at or above about 150° C. In an embodiment, a flux can be activated at lower temperatures, such as from about 100° C. to about 300° C.

Figure 1E:
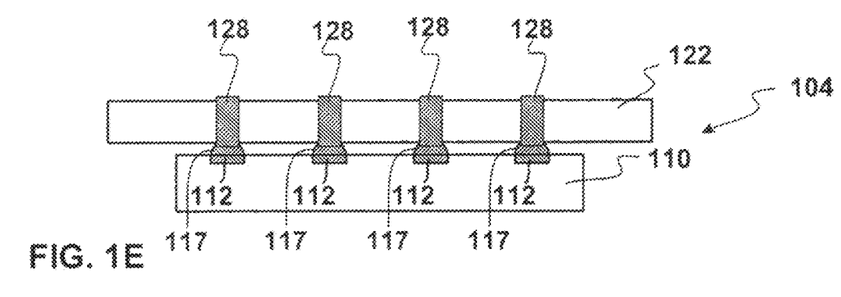
FIG. 1E is a cross section of the microelectronic device depicted in FIG. 1D after further processing.

FIG. 1E is a cross section of the microelectronic device 104 depicted in FIG. 1D after further processing. A reflow process has been commenced, during which time, a solder paste matrix, e.g., the solder paste matrix 220 depicted in FIG. 2 has been volatilized, and a metal particle composition such as the metal particle composition 218 has reflowed into a solder bump 117 with a grain size in a range from about 50 nm to less than or equal to about 20 μm. The reflow process depicted for coupling the substrate 110 to the wire interconnect 128 can precede a method of assembling a microelectronic device package. In an embodiment, the process can be simultaneous with other heat treatments of a microelectronic device package. In an embodiment, the process can follow some elements of assembling a microelectronic device package, including forming a metal particle composition die-attach embodiment. These and other embodiments are discussed subsequently.

Figure 1F:
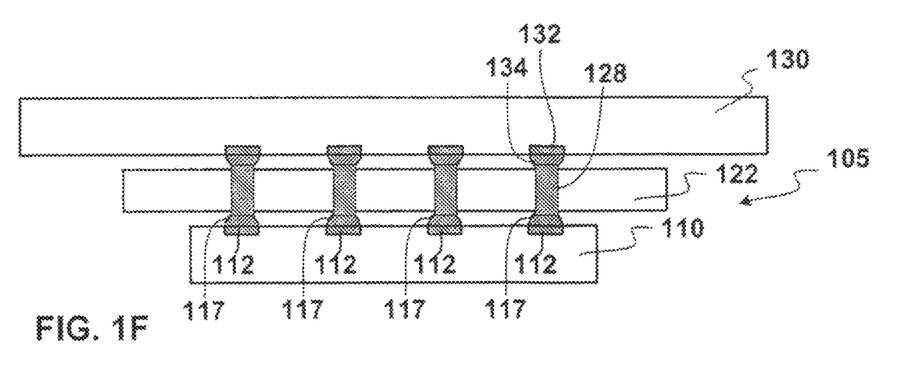
FIG. 1F is a cross section of the microelectronic device depicted in FIG. 1C after further processing according to an embodiment.

FIG. 1F is a cross section of the microelectronic device 105 depicted in FIG. 1D after further processing In an embodiment, the interconnect substrate 122 is a material that can be dissolved after the wire interconnect 128 is soldered into place. In an embodiment, the interconnect substrate 122 is a low-k dielectric material that can act as an underfill material. In an embodiment, the interconnect substrate 122 can be softened during reflow of the solder bumps 117.

In an embodiment, the bond pad 112 has a substantially square footprint and an edge dimension of about 106 μm. In an embodiment, the pitch for two adjacent bond pads 112 is about 175 μm. The interconnect substrate template 122 is configured to substantially mate with a given substrate with a bond-pad width and a pitch-matching configuration.

The microelectronic device 105 includes a mounting substrate 130, which is coupled to the substrate 110 through the wire interconnect 128 and the reflowed solder bump 117. In an embodiment, the mounting substrate 130 is a second-level substrate with a mounting substrate bond pad 132 and a mounting substrate solder bump 134. In an embodiment, the mounting substrate solder bump 134 is substantially the same metal or alloy as the wire interconnect 128 and it can be a reflowed nanosolder. Accordingly, significant electromigration is avoided because the materials of the solder bump and the wire interconnect are substantially the same metal or alloy. Similarly, the thermal mismatch is substantially avoided because the materials of the reflowed nanosolder solder bump(s) and the wire interconnect are substantially the same metal or alloy.

Figures 6, 7:
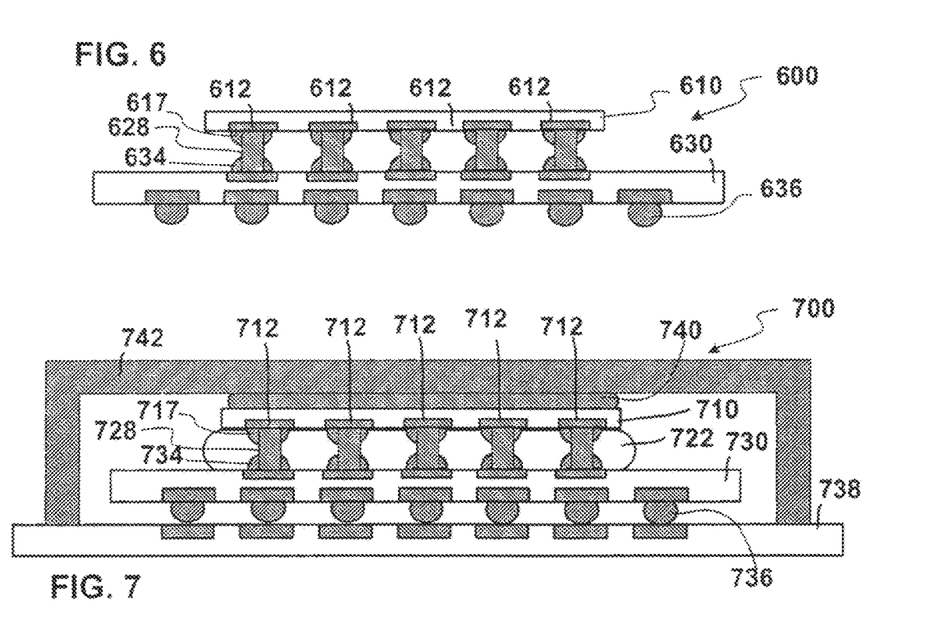
FIG. 6 is a cross section of a package according to an embodiment.
FIG. 7 is a cross section of a package according to an embodiment.

FIG. 6 is a cross section of a package 600 according to an embodiment. A substrate 610, such as a die that can be a processor, includes a bond pad 612 for electrical communication from the substrate 610 to the outside world. In an embodiment, the bond pad 612 is a copper upper metallization layer that can touch any one of several metallization layers. A reflowed nano-solder bump 617, according to the various embodiments set forth in this disclosure, is attached to the substrate 610 and to a wire interconnect 628.

In an embodiment, each wire interconnect 628 has a thickness in a range from about 20 µm to about 106 µm. In an embodiment, the wire interconnect 628 has a thickness of about 40 µm. In an embodiment, the wire interconnect 628 has a height-to-width aspect ratio in a range from about 0.5:1 to about 5:1. In an embodiment, the wire interconnect 628 has a height-to-width aspect ratio in a range from about 1:1 to about 4:1. In an embodiment, the wire interconnect 628 has a height-to-width aspect ratio in a range from about 2:1 to about 3:1. In an embodiment, the wire interconnect 628 has a height-to-width aspect ratio of about 3.5:1.

The package 600 includes a mounting substrate 630, which communicates with the substrate 610 through a mounting substrate bond pad 632. The mounting substrate bond pad 632 is soldered to the wire interconnect 628 with a mounting substrate solder bump 634. The mounting substrate solder bump 634 can also be derived from a reflowed nanosolder according to any of the embodiments set forth in this disclosure.

In an embodiment, the mounting substrate 630 is a second-level substrate such as an interposer for a processor. The mounting substrate 630 is further bumped with a board bump 636 for mounting onto a board such as a motherboard.

FIG. 7 is a cross section of a microelectronic device 700 during processing according to an embodiment. The device 700 includes a die 710 including a plurality of die bond pads 712. A reflowed nano-solder bump 717 couples the die 710 to other electrical connections. The device 700 also includes a wire interconnect 728 according to any of wire interconnect embodiments set forth in this disclosure. The wire interconnect 728 is coupled to a mounting substrate 730 through the reflowed solder bump 717, which was derived from a nano-solder paste according to any of the nano-solder paste embodiments set forth in this disclosure.

In an embodiment, the device 700 includes a board bump 736 and a board 738 such as a motherboard. In an embodiment, the die 710 is bonded by a thermal interface 740 to a heat sink 742 such as an integrated heat spreader (IHS). An interconnect template 722 is also depicted according to an embodiment. The interconnect template 722 is depicted as serving also as an underfill material, which can be softened and reflowed to protect electrical connection between the die 710 and the mounting substrate 730.

The bump embodiments set forth in this disclosure are also applicable to wire-bond technology. As the melting point initiates in the range of about 400° or lower, the process of wire bonding can be carried out under conditions to conserve the thermal budget of a wire-bond device. Further, the bond wire can be substantially the same metal or alloy as the nano-solder composition.

Figure 8:
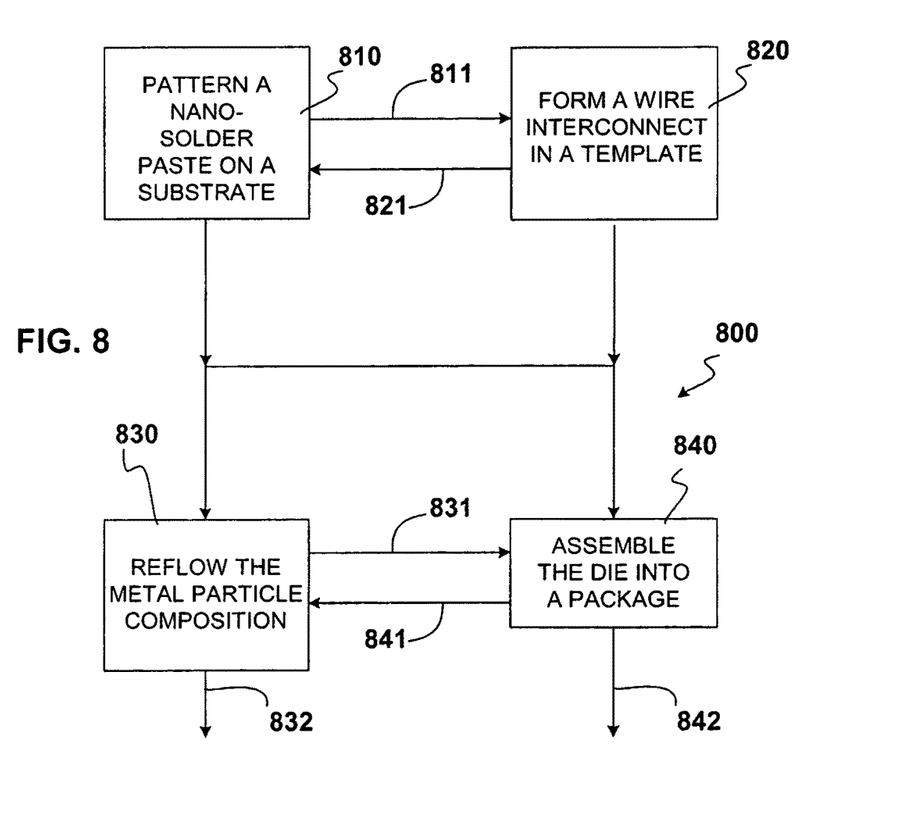
FIG. 8 is a process flow diagram according to various embodiments.

FIG. 8 is a process flow diagram 800 according to various embodiments. Processing of the nano-solder paste is carried out during a process of forming a die attach and/or a solder bump, and during a method of assembling a packaged die, respectively.

At 810, a nano-solder paste embodiment is patterned on a substrate according to any of the embodiments set forth herein.

At 820 a wire interconnect is formed in an interconnect template according to any of the embodiments set forth herein. Between 810 and 820, the process can flow either direction; through 811 or 821.

At 830, the nano-solder composition is reflowed on the substrate. By way of illustration in FIG. 1E, the reflowed, nano-solder-derived bumps 117 are depicted as forming a metal compositions at significantly lower temperatures than the melting temperatures of the individual metals as a macroscopic bulk material. At 831, the process flow can proceed from the process of reflowing the nano-particle solder paste to the method of assembling the die into a package. At 832, one process embodiment is completed.

Optionally in wire-bond technology, the process of patterning a nano-particle solder paste powder on a die is carried out seriatim during the placing of wire-bond solder bumps onto a die.

At 840, the die including the solder or the nano-particle solder paste is assembled into a package. By way of illustration, FIG. 6 depicts the assembly of a die 610 with at least a mounting substrate 630. At 841, the process flow can proceed from the method of assembling the die into a package, followed by the process of reflowing the nano-solder composition into a solder bump. At 842, one method embodiment is completed.

Figure 9:
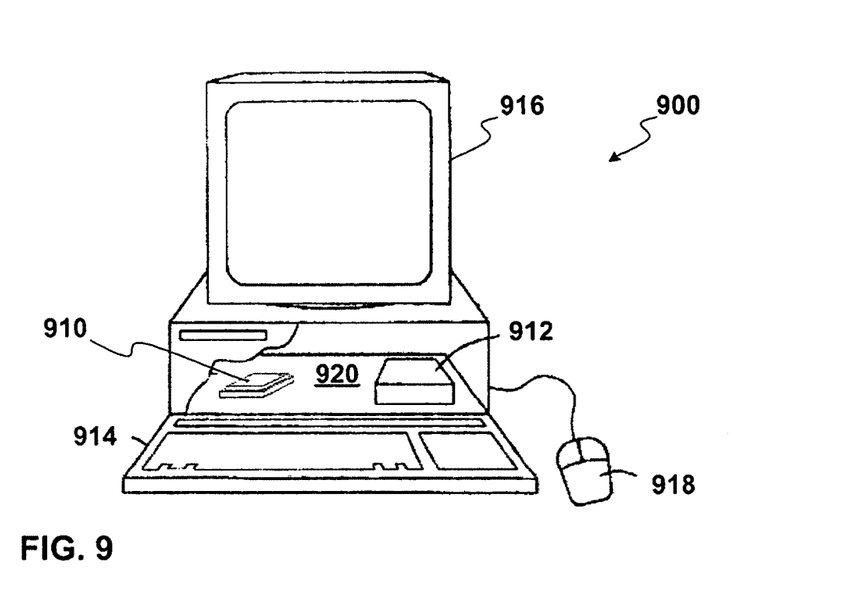
FIG. 9 is a depiction of a computing system according to an embodiment.

FIG. 9 is a depiction of a computing system 900 according to an embodiment. One or more of the foregoing embodiments of the metal particle composition, the die-attach composition, and/or the solder bump composition, may be utilized in a computing system, such as a computing system 900 of FIG. 9. Hereinafter any embodiment alone or in combination with any other embodiment is referred to as a metal particle composition embodiment(s).

The computing system 900 includes at least one processor (not pictured) that is enclosed in a package 910, a data storage system 912, at least one input device such as keyboard 914, and at least one output device such as monitor 916, for example. The computing system 900 includes a processor that processes data signals, and may include, for example, a microprocessor, available from Intel Corporation. In addition to the keyboard 914, the computing system 900 can include another user input device such as a mouse 918, for example. The computing system 900 can correspond to any of the structures that include a reflowed nanosolder or a wire interconnect with a reflowed nanosolder. Consequently the package 910 (including a die) and the board 920 are can include these structures.

For purposes of this disclosure, a computing system 900 embodying components in accordance with the claimed subject matter may include any system that utilizes a microelectronic device system, which may include, for example, at least one of the reflowed nanosolder embodiment(s) that is coupled to data storage such as dynamic random access memory (DRAM), polymer memory, flash memory, and phase-change memory. In this embodiment, the reflowed nanosolder embodiment(s) is coupled to any combination of these functionalities by being coupled to a processor. In an embodiment, however, a reflowed nanosolder composition embodiment(s) set forth in this disclosure is coupled to any of these functionalities. For an example embodiment, data storage includes an embedded DRAM cache on a die. Additionally in an embodiment, the reflowed nanosolder composition embodiment(s) that is coupled to the processor (not pictured) is part of the system with a reflowed nanosolder composition embodiment(s) that is coupled to the data storage of the DRAM cache. Additionally in an embodiment, a reflowed nanosolder composition embodiment(s) is coupled to the data storage 912.

In an embodiment, the computing system can also include a die that contains a digital signal processor (DSP), a micro controller, an application specific integrated circuit (ASIC), or a microprocessor. In this embodiment, the reflowed nanosolder composition embodiment(s) is coupled to any combination of these, functionalities by being coupled to a processor. For an example embodiment, a DSP (not pictured) is part of a chipset that may include a stand-alone processor (in package 910) and the DSP as separate parts of the chipset on the board 920. In this embodiment, a reflowed nanosolder composition embodiment(s) is coupled to the DSP, and a separate reflowed nanosolder composition embodiment(s) may be present that is coupled to the processor in package 910. Additionally in an embodiment, a reflowed nanosolder composition embodiment(s) is coupled to a DSP that is mounted on the same board 920 as the package 910. It can now be appreciated that the reflowed nanosolder composition embodiment(s) can be combined as set forth with respect to the computing system 900, in combination with a reflowed nanosolder composition embodiment(s) as set forth by the various embodiments of this disclosure and their equivalents.

Reflowed nanosolder composition embodiments set forth in this disclosure can be applied to devices and apparatuses other than a traditional computer. For example, a die can be packaged with a reflowed nanosolder composition embodiment(s), and placed in a portable device such as a wireless communicator or a hand-held device such as a personal data assistant and the like. Another example is a die that can be packaged with a reflowed nanosolder composition embodiment(s) and placed in a vehicle such as an automobile, a locomotive, a watercraft, an aircraft, or a spacecraft.

In an embodiment, operation of the computing system 900 is carried out with a current density that would otherwise be harmful to a conventional bump-and-wire interconnect structure. In an embodiment, operation of the computing system 900 is carried out with a current density between about $10^3$ amp/cm$^2$ and about $10^6$ amp/cm$^2$. In an embodiment, operation of the computing system 900 is carried out with a current density between about $10^4$ amp/cm$^2$ and about $10^6$ amp/cm$^2$. In an embodiment, operation of the computing system 900 is carried out with a current density between about $10^5$ amp/cm$^2$ and about $10^6$ amp/cm$^2$. In an embodiment, operation of the computing system 900 is carried out with a current density above $10^6$ amp/cm$^2$, but below a current density that would cause the specific materials of the wire interconnect and the reflowed nano-solder bump to reach a solidus point.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A wire interconnect article comprising:
    a solder bump disposed upon a bond pad that is disposed on a die, wherein the solder bump includes a first metal and a grain size in a range from about 50 nanometer to less than or equal to about 20 micrometer;
    a mounting substrate solder bump that also includes the first metal and that is disposed on a mounting substrate;
    a wire interconnect in contact with the solder bump on the die and the mounting substrate solder bump on the mounting substrate, wherein the wire interconnect is substantially the same metal as the first metal, wherein the wire interconnect has a thickness in a range from about 20 micron to about 120 micron, wherein the wire interconnect includes a height-to-width aspect ratio in a range from 0.5:1 to 5:1, and wherein the wire interconnect includes a composite of a seed layer shell and a plated core; and
    a wire interconnect template enveloping the wire interconnect, wherein the wire interconnect template includes an interconnect substrate with an upper surface proximate the die and a lower surface proximate the mounting substrate, wherein the wire interconnect extends at least one of above and below the interconnect substrate.

2. The wire interconnect article of claim 1, wherein the wire interconnect includes a height-to-width aspect ratio in a range from 2:1 to 3:1, wherein the wire interconnect, the solder bump on the die, and the mounting substrate solder bump are each copper, and wherein the solder bump on the die and the mounting substrate solder bump each have a grain size in a range from about 50 nanometer to about 1 micrometer.

3. The wire interconnect article of claim 1, wherein the wire interconnect is a metal or alloy selected from the group consisting of silver, copper, gold, a gold tin alloy, Au80Sn20, tin, and tin-silver.

* * * * *